US011973457B2

(12) United States Patent
Occhipinti et al.

(10) Patent No.: US 11,973,457 B2
(45) Date of Patent: Apr. 30, 2024

(54) CIRCUIT, CORRESPONDING SYSTEM, VEHICLE AND METHOD OF OPERATION (71) Applicants: STMicroelectronics S.r.l., Agrate Brianza (IT); STMicroelectronics Application GMBH, Aschheim-Dornach (DE); STMicroelectronics (Alps) SAS, Grenoble (FR)

(72) Inventors: Aldo Occhipinti, Catania (IT); Christophe Roussel, Claix (FR); Fritz Burkhardt, Munich (DE); Ignazio Testoni, Catania (IT)

(73) Assignees: STMicroelectronics (Alps) SAS, Grenoble (FR); STMicroelectronics S.r.l., Agrate Brianza (IT); STMicroelectronics Application GMBH, Aschheim-Dornach (DE)

( * ) Notice: Subject to any disclaimer, the term of this patent is extended or adjusted under 35 U.S.C. 154(b) by 340 days.

(21) Appl. No.: 17/323,602

(22) Filed: May 18, 2021

(65) Prior Publication Data
US 2021/0384852 A1    Dec. 9, 2021

(30) Foreign Application Priority Data
Jun. 3, 2020   (IT) ........................ 102020000013165

(51) Int. Cl.
*H02P 3/18*        (2006.01)
*E05F 15/60*       (2015.01)
(Continued)

(52) U.S. Cl.
CPC ............... *H02P 7/04* (2016.02); *E05F 15/60* (2015.01); *H02P 7/29* (2013.01); *H03K 3/0377* (2013.01);
(Continued)

(58) Field of Classification Search
CPC .................................. H02P 6/12; H02P 27/10
See application file for complete search history.

(56) References Cited

U.S. PATENT DOCUMENTS

| | | | |
|---|---|---|---|
| 9,018,883 B2 * | 4/2015 | Shibataka | H02P 6/28 318/599 |
| 2009/0135531 A1 * | 5/2009 | Hirata | H02P 7/29 361/18 |

(Continued)

FOREIGN PATENT DOCUMENTS

| | | |
|---|---|---|
| CN | 104271410 A | 1/2015 |
| CN | 104885320 A | 9/2015 |

(Continued)

*Primary Examiner* — Muhammad S Islam
*Assistant Examiner* — Charles S Laughlin
(74) *Attorney, Agent, or Firm* — Slater Matsil, LLP (57) ABSTRACT An embodiment driver circuit comprises a power supply pin configured to receive a power supply voltage, and a set of control pins configured to provide a set of control signals for controlling switching of a set of switches of an h-bridge circuit comprising a pair of high-side switches and a pair of low-side switches. The driver circuit comprises control circuitry coupled to the control pins and configured to generate the control signals, and sensing circuitry coupled to the power supply pin and configured to generate a detection signal indicative of the power supply voltage exceeding a threshold value. The control circuitry is sensitive to the detection signal and is configured to generate the control signals to activate one of the pair of high-side switches and the pair of low-side switches and de-activate the other of the pair of high-side switches and the pair of low-side switches.

20 Claims, 3 Drawing Sheets (51) Int. Cl.
*H02P 6/16* (2016.01)
*H02P 7/03* (2016.01)
*H02P 7/29* (2016.01)
*H03K 3/037* (2006.01)
*H03K 17/687* (2006.01)
*B60J 5/10* (2006.01)
*B60R 16/033* (2006.01)

(52) U.S. Cl.
CPC .......... *H03K 17/6871* (2013.01); *B60J 5/10* (2013.01); *B60R 16/033* (2013.01); *E05Y 2201/434* (2013.01); *E05Y 2900/548* (2013.01); *H03K 2217/0063* (2013.01); *H03K 2217/0072* (2013.01); *H03K 2217/0081* (2013.01)

(56) References Cited

U.S. PATENT DOCUMENTS

| | | |
|---|---|---|
| 2014/0375282 A1 | 12/2014 | Horihata |
| 2015/0207437 A1 | 7/2015 | Nagler |
| 2017/0070167 A1* | 3/2017 | Nagler ..................... H02P 3/12 |

FOREIGN PATENT DOCUMENTS

| | | |
|---|---|---|
| CN | 216390831 U | 4/2022 |
| DE | 102012101508 A1 | 8/2013 |
| IT | 201700034687 A1 | 9/2018 |
| JP | 2009029368 A | 2/2009 |

* cited by examiner

CIRCUIT, CORRESPONDING SYSTEM, VEHICLE AND METHOD OF OPERATION

CROSS-REFERENCE TO RELATED APPLICATIONS

This application claims priority to Italian Application No. 102020000013165, filed on Jun. 3, 2020, which application is hereby incorporated herein by reference.

TECHNICAL FIELD

The description relates to driving electric motors, e.g., DC electric motors, and associated methods.

BACKGROUND

Direct current (DC) motors may be used in a wide variety of applications. For instance, they may be used to automatically operate (e.g., open and close) trunks, tail gates, and in general any kind of power operated latch in a vehicle.

Such DC motors may be driven by means of known circuit arrangements such as h-bridge circuits. A conventional h-bridge circuit comprises a first branch (or leg) comprising a first high-side switch and a first low-side switch, and a second branch (or leg) comprising a second high-side switch and a second low-side switch. The two branches are connected in parallel between a power supply node and a voltage reference node (e.g., a ground node). The electric DC motor is connected between the intermediate nodes of the first and second branches. The switches in the h-bridge circuit may comprise solid-state switches such as, for instance, MOS transistors.

When an h-bridge circuit is used to drive an electric DC motor in a conventional power operated trunk application (e.g., in a vehicle), manual movement of the trunk (e.g., operated by a user) may result in the electric motor acting as an electric generator. In turn, this may result in an over-voltage (OV) being generated at a supply voltage pin of a driver circuit which drives the h-bridge circuit. Such over-voltage may exceed the absolute maximum ratings (AMR) of the supply voltage pin. As a result, a re-circulating current may arise, possibly damaging the driver circuit.

The above-described scenario may happen when the supply voltage pin of the driver circuit is connected to a power source (e.g., a battery as conventionally provided in a vehicle), which corresponds to normal operation of the DC motor, or when the supply voltage pin is not connected to a power source (e.g., at the End Of Line (EOL) of a manufacturing process for manufacturing the vehicle, when a power trunk electronic control unit (ECU) may be mounted in the vehicle and the battery may not be mounted or connected yet).

SUMMARY

An object of one or more embodiments is that of providing h-bridge driver circuits with improved robustness against possible over-voltage events.

According to one or more embodiments, such an object can be achieved by means of a circuit having the features set forth in the claims that follow.

One or more embodiments may relate to a corresponding system (e.g., a system for driving an electric motor).

One or more embodiments may relate to a corresponding vehicle.

One or more embodiments may relate to a corresponding method of operating the circuit.

The claims are an integral part of the technical teaching provided herein in respect of the embodiments.

According to one or more embodiments, a circuit may comprise a power supply pin configured to receive a power supply voltage, and a set of control pins configured to provide a set of respective control signals for controlling the switching activity of a set of respective switches of an h-bridge circuit. The set of respective switches may comprise a pair of high-side switches and a pair of low-side switches.

According to one or more embodiments, the circuit may comprise control circuitry coupled to the set of control pins and configured to generate the set of control signals, and sensing circuitry coupled to the power supply pin and configured to generate a detection signal indicative of the power supply voltage exceeding a threshold value.

According to one or more embodiments, the control circuitry may be sensitive to the detection signal and may be configured to generate the control signals to activate one of the pair of high-side switches and the pair of low-side switches, and de-activate the other of the pair of high-side switches and the pair of low-side switches as a result of the detection signal being indicative of the power supply voltage exceeding the threshold value.

Therefore, one or more embodiments may advantageously provide cost-effective solutions for driving h-bridge circuits with over-voltage protection.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

Throughout the figures annexed herein, like parts or elements are indicated with like references/numerals and a corresponding description will not be repeated for brevity.

The headings/references used herein are provided merely for convenience and hence do not define the extent of protection or the scope of the embodiments.

Figure 1:
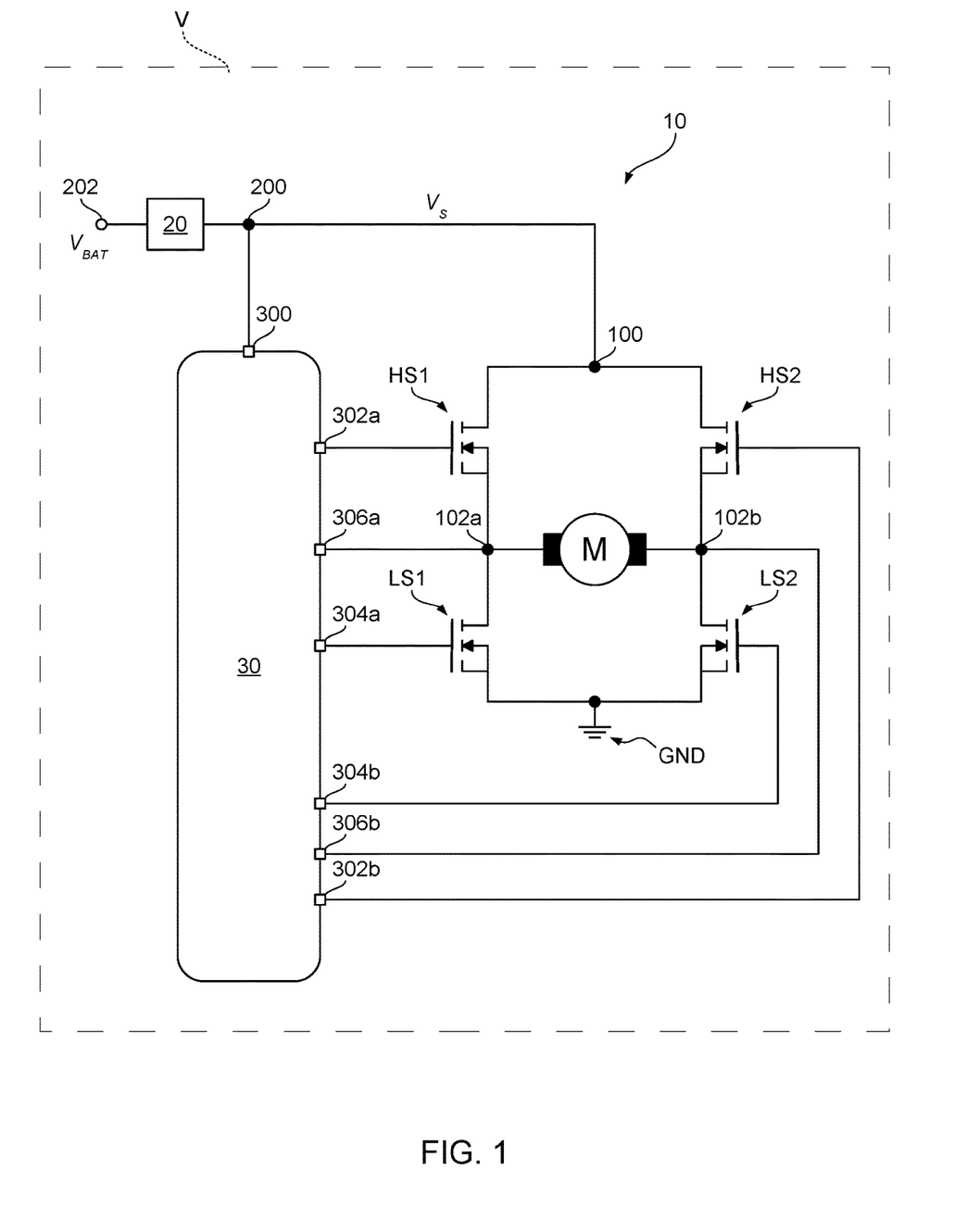
FIG. 1 is a circuit block diagram exemplary of a device for driving an electric motor.

By way of introduction to the detailed description of exemplary embodiments, reference may be first made to FIG. 1. FIG. 1 is a circuit block diagram exemplary of a device 10 for driving an electric motor M, e.g., a DC motor, according to one or more embodiments.

The device 10 may comprise an h-bridge circuit to operate the electric motor M. The h-bridge circuit may comprise a first branch (or leg) comprising a first high-side switch HS1 and a first low-side switch LS1, and a second branch (or leg) comprising a second high-side switch HS2 and a second low-side switch LS2. The two branches may be connected in parallel between a power supply node too and a voltage reference node GND (e.g., a ground node). The electric motor M may be coupled between a first node 102a intermediate the switches HS1 and LS1, and a second node 102b intermediate the switches HS2 and LS2. As exemplified in FIG. 1, the switches HS1, HS2, LS1, LS2 in the h-bridge circuit may comprise solid-state switches such as, for instance, MOS transistors.

The device 10 may further comprise a driver circuit 30 (e.g., an integrated circuit, IC) configured to drive the h-bridge circuit. As exemplified in FIG. 1, the driver circuit 30 may comprise a power supply pin 300 configured to receive a supply voltage $V_S$, a first high-side control pin 302a configured to control switching of the first high-side switch HS1, and a second high-side control pin 302b configured to control switching of the second high-side switch HS2, a first low-side control pin 304a configured to control switching of the first low-side switch LS1, and a second low-side control pin 304b configured to control switching of the second low-side switch LS2, and a first sensing pin 306a configured to sense a voltage signal at the node 102a intermediate the switches HS1, LS1 and to facilitate activating (e.g., switching on) the high-side switch HS1, and a second sensing pin 306b configured to sense a voltage signal at the node 102b intermediate the switches HS2, LS2 and to facilitate activating (e.g., switching on) the high-side switch HS2.

In one or more embodiments where the switches HS1, HS2, LS1 and LS2 comprise MOS transistors, the control pins 302a, 302b, 304a and 304b may be coupled to the respective gate terminals.

The devices available under the trade designation L99DZ200G with companies of the group of companies of the Applicant are door zone systems integrated circuits (IC) which may be suitable to implement a driver circuit 30 as exemplified herein.

In one or more embodiments as exemplified in FIG. 1, the power supply node too of the h-bridge circuit and the power supply pin 300 of the driver circuit 30 may be configured to receive a supply voltage $V_S$ from an output node 200 of a reverse battery circuit 20.

Figure 2:
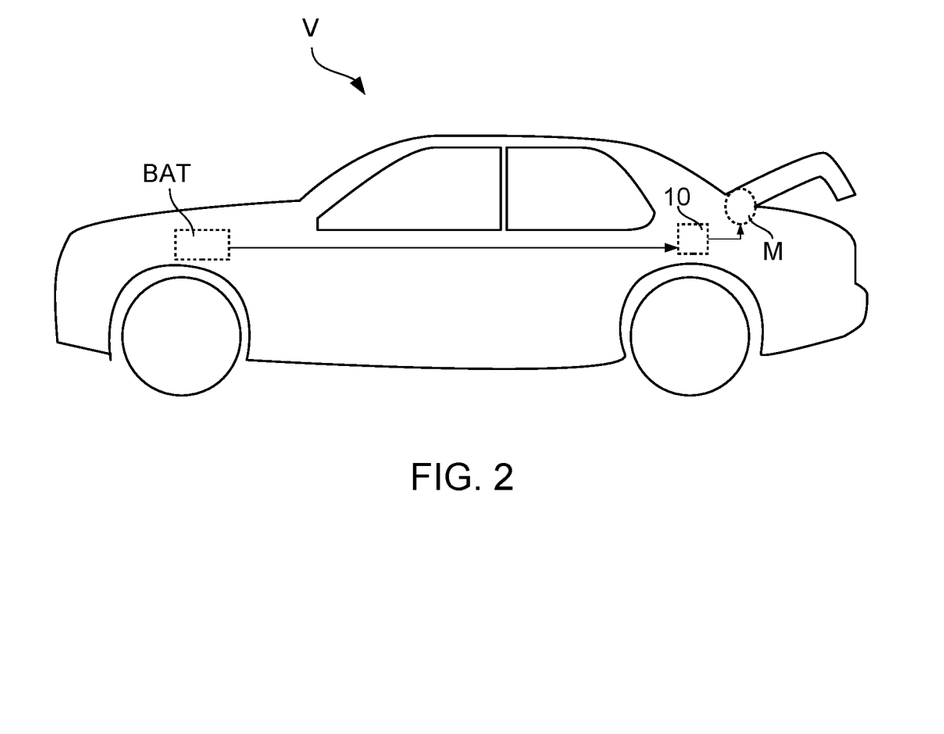
FIG. 2 is exemplary of possible applications of one or more embodiments.

The reverse battery circuit 20 may be configured to receive a certain supply voltage $V_{BAT}$ at an input node 202 (e.g., from a power source such as a 12 V battery BAT as conventionally provided in a vehicle V, see also FIG. 2) and provide the supply voltage $V_S$ at its output node 200.

In one or more embodiments, the reverse battery circuit 20 may be configured to protect the device 10 in case the polarity of the supply voltage $V_{BAT}$ is inverted. For instance, this may happen during maintenance operations performed on the vehicle V, or during jump start operation of the vehicle V.

In various applications (such as, for instance, using the motor M to automatically operate a trunk in the vehicle V, as exemplified in FIG. 2), the electric motor M may be forced to move (e.g., rotate) due to the application of an external force, e.g., due to a user manually opening or closing the trunk of the vehicle.

As previously discussed, this may result in an over-voltage (OV) being generated at the node too and propagated to the power supply pin 300 of the driver circuit 30, possibly exceeding the absolute maximum ratings (AMR) of the power supply pin 300, which may be, for instance, in the range of −0.3 V to +28 V.

According to certain conventional solutions, an h-bridge driver circuit may be provided with protection against over-voltage events by resorting to the use of high voltage capability components (i.e., electrical components which are able to withstand an extra voltage applied thereto) and/or the use of additional passive components, such as Zener diodes, in order to limit the maximum voltage possibly applied to the internal circuitry of the driver circuit.

It is noted that such conventional solutions may turn out to be costly.

Figure 3:
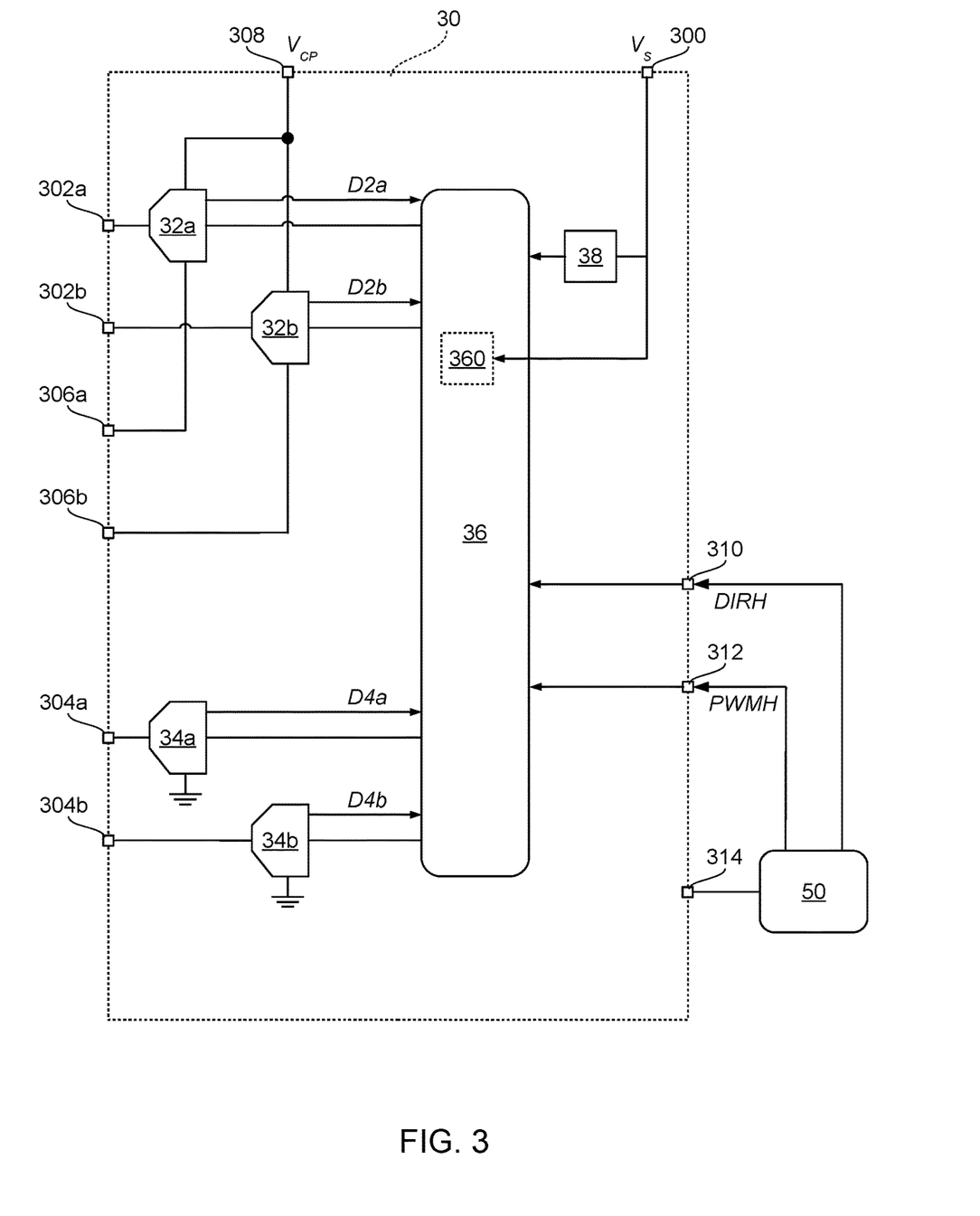
FIG. 3 is a circuit block diagram exemplary of an h-bridge driver circuit according to one or more embodiments.

Therefore, one or more embodiments as exemplified in FIG. 3 may relate to a driver circuit 30 for an h-bridge circuit (the h-bridge circuit not being visible in FIG. 3), wherein the driver circuit 30 is configured to selectively operate in a so-called "generator mode" to provide improved robustness against over-voltage events.

When operating in the generator mode, the driver circuit 30 may sense the occurrence of an over-voltage event at the power supply pin 300 and, as a result of an over-voltage event being sensed, may activate (e.g., switch to a conductive state) both the low-side switches LS1 and LS2 of the h-bridge circuit connected thereto (i.e., to connect both terminals of the motor M to the reference voltage node GND). By shorting both terminals of the motor M to a same voltage node, a braking action may be exerted on the motor M, thereby counter-acting the over-voltage at the supply voltage pin 300 and protecting the driver circuit 30.

As exemplified in FIG. 3, a driver circuit 30 according to one or more embodiments may comprise a first power supply pin 300 configured to receive the supply voltage $V_S$ as previously described with reference to FIG. 1, control pins 302a, 302b, 304a, 304b and sensing pins 306a, 306b configured to control an h-bridge circuit as previously described with reference to FIG. 1, a second power supply pin 308 configured to receive a supply voltage $V_{CP}$ from a charge pump circuit (the charge pump circuit not being visible in the Figures, and being possibly comprised in the driver circuit 30), a first input pin 310 configured to receive a digital signal DIRH from a processing unit 50, e.g., a micro-controller unit in the vehicle V, a second input pin 312 configured to receive a digital signal PWMH from the processing unit 50, and an output supply pin 314 configured to provide a regulated supply voltage to the processing unit 50 (e.g., a 5 V regulated voltage).

As exemplified in FIG. 3, a driver circuit 30 according to one or more embodiments may comprise a first high-side gate driver circuit 32a configured to provide a control signal to the control pin 302a, and a second high-side gate driver circuit 32b configured to provide a control signal to the control pin 302b, a first low-side gate driver circuit 34a configured to provide a control signal to the control pin 304a, and a second low-side gate driver circuit 34b configured to provide a control signal to the control pin 304b, an interface, logic and diagnostic circuit 36 configured to control activation of the gate driver circuits 32a, 32b, 34a and 34b, and an over-voltage detector circuit 38 coupled to the power supply pin 300 to detect over-voltage events.

In one or more embodiments, the gate driver circuits 32a, 32b, 34a and 34b may comprise push-pull stages configured to drive the gate terminals of MOS transistors HS1, HS2, LS1, LS2.

As exemplified in FIG. 3, the high-side gate driver circuits 32a and 32b may be configured to receive from a charge pump circuit a supply voltage $V_{CP}$ which may be higher than the supply voltage $V_S$, e.g., about 10 V higher than the supply voltage $V_S$, so to be able to properly drive the high-side switches HS1, HS2. The charge pump circuit may be de-activated for security reasons as a result of an over-voltage event being detected at the power supply pin 300. Therefore, while a braking action may hypothetically be exerted on the motor M by activating at the same time both the high-side switches HS1, HS2 in the place of the low-side switches LS1, LS2 (which would resulting in shorting both terminals of the motor M to the same voltage node too), preferred embodiments may rely on activation of the low-side switches in order to protect the driver circuit 30 from over-voltage events, insofar as activation of the high-side switches may not be possible during an over-voltage event.

The digital signal DIRH received at the logic circuit 36 may be a binary signal used to control the direction of movement of the motor M (i.e., clockwise or counterclockwise). For instance, a first value of the signal DIRH (e.g., 0) may enable activation of the pair of switches HS1, LS2, and a second value of the signal DIRH (e.g., 1) may enable activation of the pair of switches HS2, LS1.

The digital signal PWMH received at the logic circuit 36 may be a signal used to control the activation of the motor M (e.g., to control the amount of torque delivered by the motor M or its rotation speed). For instance, the signal PWMH may comprise a square wave signal having a duty-cycle variable between 0% (corresponding to zero torque delivered by the motor M) and 100% (corresponding to maximum torque delivered by the motor M).

Therefore, in one or more embodiments the logic circuit 36 may be configured (e.g., via internal configuration registers) to activate the gate driver circuits 32a, 32b, 34a and 34b as a function of the values of signals DIRH and PWMH.

Additionally, in one or more embodiments the gate driver circuits 32a, 32b, 34a and 34b may be configured to report diagnostic information to the diagnostic circuit 36 via respective signals D2a, D2b, D4a, D4b.

In one or more embodiments, the over-voltage detector circuit 38 may comprise an analog comparator circuit configured to compare the supply voltage $V_S$ to an analog threshold value, possibly with hysteresis, to provide to the logic circuit 36 an output signal indicative of an over-voltage event detected at the power supply pin 300.

Purely by way of non-limiting example, in the circuit 38 the supply voltage $V_S$ may be compared to an upper threshold value $V_{A,H}$ in the range of 22.5 V to 25.5 V, preferably equal to 24.0 V, and to a lower threshold value $V_{A,L}$ in the range of 21.0 V to 25.0 V, preferably equal to 22.5 V, thereby resulting in a hysteretic behavior. The hysteresis value may be in the range of 0.5 V to 1.5 V, with a preferred value of about 1.0 V.

In one or more embodiments, detection of an over-voltage event at the over-voltage detector circuit 38 may thus be implemented as a "live" (or "real-time") functionality, i.e., the output signal of the over-voltage detector circuit 38 may be asserted and de-asserted based (only) on the comparison of the supply voltage $V_S$ to one or more thresholds $V_{A,H}$, $V_{A,L}$.

The over-voltage detector circuit 38 may sink an additional quiescent current of about 1 μA.

As exemplified in FIG. 3, the logic circuit 36 may be configured to run a logic routine 360, which may be referred to as a "supply voltage monitor" routine in the present description. In particular, the logic routine 360 may comprise sampling the value of the supply voltage $V_S$ by means of an analog-to-digital converter (ADC) running at a determined sampling rate within the logic circuit 36, and comparing the sampled value to a digital threshold value, possibly with hysteresis, so as to monitor over-voltage events at the power supply pin 300.

Purely by way of non-limiting example, the supply voltage $V_S$ sampled by the logic circuit 36 may be compared to an upper threshold value $V_{D,H}$ in the range of 19.5 V to 22.5 V, and to a lower threshold value $V_D$r in the range of 18.5 V to 22.5 V, thereby resulting in a hysteretic behavior. The hysteresis value may be in the range of 0.5 V to 1.5 V, with a preferred value of about 1.0 V.

The supply voltage monitoring routine 360 may sink an additional quiescent current of about 250 μA.

Therefore, one or more embodiments may be provided with both an analog over-voltage detector circuit 38 and a digital supply voltage monitoring routine 360 to detect and/or monitor over-voltage events at the power supply node 300. Also in view of their different power consumption, the analog detector circuit 38 and the digital monitoring routine 360 may be selectively activated as a function of the operating state of the driver circuit 30, as further detailed in the following.

In one or more embodiments, the driver circuit 30 may be configured to operate according to different operation states. For instance, operation of the driver circuit 30 may be managed by a state machine 40 as exemplified in FIG. 4, comprising an active operation state A, a stand-by operation state SB and a fail-safe operation state FS.

Figure 4:
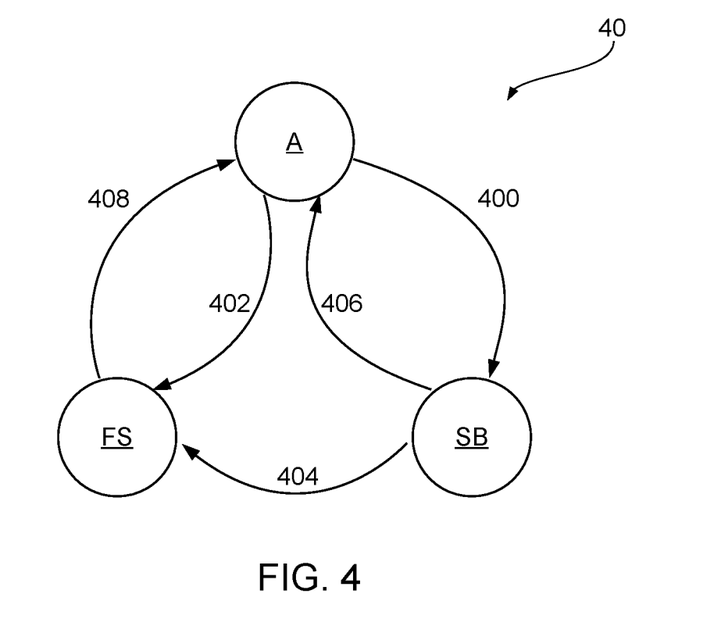
FIG. 4 is a simplified state machine exemplary of possible operation of one or more embodiments.

In the active operation state A, the device 10 and the driver circuit 30 may be fully functional, e.g., all the available functionalities may be activated.

In the stand-by operation state SB, some functionalities of the driver circuit 30 may not be activated, with the aim of reducing power dissipation. For instance, communication between the driver circuit 30 and the processing unit 50 may be disabled, and operation of the driver circuit 30 may be reduced so as to lower the power consumption.

In the fail-safe operation state FS, the device 10 is set to a safe condition, e.g., a condition which is not harmful for the passengers of the vehicle V. Also in this state, some functionalities of the driver circuit 30 may not be activated.

By way of example, in the stand-by operation state SB and in the fail-safe operation state FS the logic circuit 36 may not be enabled to drive any of the gate driver circuits 32a, 32b, 34a, 34b to activate any of the switches in the h-bridge circuit, and the charge pump circuit providing the supply voltage $V_{CP}$ may be off. In the stand-by state SB and in the fail-safe operation state FS, the logic circuit 36 may not be enabled to run the supply voltage monitoring routine 360, since the ADC in the logic circuit 36 may be de-activated. In the stand-by operation state SB and in the fail-safe operation state FS the over-voltage detector circuit 38 may be active to detect over-voltage events at the power supply pin 300.

As exemplified in FIG. 4, a driver circuit 30 operating in the active state A may switch to the stand-by state SB as a result of a command received (arrow 400), e.g., a command received from the processing unit 50 via an SPI interface. Alternatively, a driver circuit 30 operating in the active state A may (automatically) switch to the fail-safe state FS as a result of a fault condition being detected (arrow 402), e.g., a watchdog fail being detected. Switching to the fail-safe state FS may also take place from the stand-by state SB (arrow 404), under the same conditions of a fault condition being detected.

It is noted that over-voltage events may occur at the power supply pin 300 while the driver circuit 30 operates in any of the active, stand-by and fail-safe operation states.

It is noted that in one or more embodiments activation of both the low-side switches LS1, LS2 for braking the motor M may take place (only) provided that the driver circuit 30 is operating in the active operation state A, since in the other operation states the logic circuit 36 may not be enabled to drive any of the gate driver circuits 32a, 32b, 34a, 34b.

Therefore, in one or more embodiments, as a result of an over-voltage event occurring and being detected by the analog monitor circuit 38 while the driver circuit 30 is operating in the stand-by or fail-safe operation states, the driver circuit 30 may switch to the active operation state (e.g., it may "wake up": see arrows 406,408 in FIG. 4).

Once switched to the active operation state A, the driver circuit 30 may subsequently activate both the low-side switches LS1, LS2 for braking the motor M, depending on the outcome of the supply voltage monitoring routine 360.

In one or more embodiments, the driver circuit 30 may be configured, when operating in the active operation state A, to manage a time cross-current protection (TCCP) to avoid cross-current conduction between high-side and low-side switches in the h-bridge circuit. For instance, such a cross-current protection feature may be managed in digital by the logic circuit 36 inhibiting the contemporary activation of both switches in the same branch of the h-bridge circuit.

In one or more embodiments, a control register of the driver circuit 30 (e.g., comprised in the interface, logic and diagnostic circuit 36) may comprise a dedicated configuration bit (e.g., GENERATOR_MODE_EN). As a function of the value of the dedicated configuration bit, the generator mode of the driver circuit 30 may be enabled (e.g., if GENERATOR_MODE_EN=1) or disabled (e.g., if GENERATOR_MODE_EN=0). The over-voltage detector circuit 38 may be enabled or disabled accordingly. In one or more embodiments, the supply voltage monitor routine 360 may be enabled as a result of the driver circuit 30 operating in the active operation state A, independently from the generator mode being enabled or not.

Therefore, in one or more embodiments the over-voltage detector circuit 38 and the supply voltage monitoring routine 360 may be enabled or disabled as exemplified in Table I below:

In the active operation state, in response to an overvoltage event being detected by the monitoring routine 360 and the generator mode being enabled (GENERATOR_MODE_EN=1), the low-side switches in the h-bridge circuit may be activated and the charge pump circuit may be switched off.

In the active operation state, in response to an overvoltage event being detected by the monitoring routine 360 and the generator mode being disabled (GENERATOR_MODE_EN=0), the h-bridge circuit may be switched off and the charge pump circuit may be switched off.

Providing the possibility of selectively activating the generator mode may be advantageous, for instance, in case the driver circuit 30 is used in power operated trunk (POT) applications. For instance, the driver circuit 30 may comprise additional circuitry configured to manage the electronics of other latches of the vehicle (e.g., the doors of a motor car). In this case, enabling the generator mode may not be needed. In one or more embodiments, the default value of the dedicated configuration bit GENERATOR_MODE_EN may be equal to 1 so as to result in the generator mode being enabled by default at the startup of the device.

One or more embodiments may benefit from the fact that implementation of the "generator mode" may be embedded inside the driver circuit 30 and may be completely autonomous, so that reaction to over-voltage events may be fast insofar as it may not involve operation of any component external to the driver circuit 30 itself (for example, operation of the processing circuit 50). Therefore, one or more embodiments may facilitate timely activating the low-side switches LS1, LS2 as a result of an over-voltage event being sensed at the supply voltage pin 300.

Additionally, one or more embodiments may provide driver circuits and arrangements for h-bridges with over-voltage protection at a reduced cost if compared to previous solutions.

Additionally, one or more embodiments may provide over-voltage protection implemented in hardware, without the need of developing specific software for this purpose.

As exemplified herein, a circuit (e.g., 30) may comprise a power supply pin (e.g., 300) configured to receive a power supply voltage (e.g., $V_S$), a set of control pins (e.g., 302a, 302b, 304a, 304b) configured to provide a set of respective control signals for controlling the switching activity of a set of respective switches (e.g., HS1, HS2, LS1, LS2) of an h-bridge circuit, wherein the set of respective switches comprises a pair of high-side switches (e.g., HS1, HS2) and a pair of low-side switches (e.g., LS1, LS2), control circuitry (e.g., 36) coupled (e.g., 32a, 32b, 34a, 34b) to the set of control pins and configured to generate the set of control signals (e.g., as a function of at least one input signal such as DIRH, PWMH received from a processing unit such as 50), and sensing circuitry (e.g., 38, 360) coupled to the power supply pin and configured to generate a detection signal indicative of the power supply voltage exceeding a threshold value.

As exemplified herein, the control circuitry may be sensitive to the detection signal and may be configured to

TABLE I

| Operation State | | Detector circuit 38 | Monitoring routine 360 |
|---|---|---|---|
| STAND-BY or FAIL-SAFE | GENERATOR_MODE_EN = 1 | ENABLED | DISABLED |
| | GENERATOR_MODE_EN = 0 | DISABLED | DISABLED |
| ACTIVE | GENERATOR_MODE_EN = 1 | DISABLED | ENABLED |
| | GENERATOR_MODE_EN = 0 | DISABLED | ENABLED | generate the control signals to activate one of the pair of high-side switches and the pair of low-side switches, and de-activate the other of the pair of high-side switches and the pair of low-side switches as a result of the detection signal being indicative of the power supply voltage exceeding the threshold value.

As exemplified herein, the sensing circuitry coupled to the power supply pin may comprise an analog comparator circuit (e.g., 38) configured to compare the power supply voltage to at least one respective threshold value.

As exemplified herein, the analog comparator circuit may comprise a comparator circuit with hysteresis, the comparator circuit with hysteresis having a lower threshold value preferably between 21.0 V and 25.0 V, more preferably equal to 22.5 V, and a higher threshold value preferably between 22.5 V and 25.5 V, more preferably equal to 24.0 V.

As exemplified herein, the analog comparator circuit may be selectively enable-able or disable-able, preferably as a function of a value stored in a control register of the driver circuit.

As exemplified herein, the sensing circuitry coupled to the power supply pin may comprise an analog-to-digital converter circuit configured to provide a digital representation of the power supply voltage, and a digital circuit (e.g., 360) configured to compare the digital representation of the power supply voltage to at least one respective threshold value (e.g., at a determined sampling rate).

As exemplified herein, the digital circuit may comprise a digital comparator circuit with hysteresis, the digital comparator circuit with hysteresis having a lower threshold value preferably between 18.5 V and 22.5 V and a higher threshold value preferably between 19.5 V and 22.5 V.

As exemplified herein, the control circuitry may be configured (e.g., 40) to operate, alternatively, in an active operation state (e.g., A), wherein the control circuitry is enabled to generate the set of control signals and the digital circuit is enabled, and, in at least one inactive operation state (e.g., SB, FS), wherein the control circuitry is not enabled to generate the set of control signals and the digital circuit is not enabled.

As exemplified herein, the control circuitry may be configured to switch from the at least one inactive operation state to the active operation state as a result of the detection signal generated by the analog comparator circuit being indicative of the power supply voltage exceeding the threshold value.

As exemplified herein, the control circuitry may be configured to generate the control signals to activate the pair of low-side switches and de-activate the pair of high-side switches as a result of the detection signal being indicative of the power supply voltage exceeding the threshold value.

As exemplified herein, a system may comprise an electric motor (e.g., M), an h-bridge circuit coupled to the electric motor and configured to drive the electric motor, a circuit according to one or more embodiments coupled to the h-bridge circuit, a power source (e.g., BAT) configured to provide the power supply voltage to the power supply pin of the circuit and to the h-bridge circuit, and a processing unit (e.g., 50) coupled to the circuit and configured to generate at least one input signal (e.g., DIRH, PWMH) for controlling the circuit.

As exemplified herein, a vehicle (e.g., V) may comprise a system according to one or more embodiments, wherein the electric motor may operate a power operated trunk of the vehicle.

As exemplified herein, a method of operating a circuit according to one or more embodiments may comprise receiving a power supply voltage, providing a set of control signals for controlling the switching activity of a set of respective switches of an h-bridge circuit, wherein the set of respective switches comprises a pair of high-side switches and a pair of low-side switches, generating the set of control signals as a function of at least one input signal received from a processing unit, generating a detection signal indicative of the power supply voltage exceeding a threshold value, and generating the set of control signals to activate one of the pair of high-side switches and the pair of low-side switches and de-activate the other of the pair of high-side switches and the pair of low-side switches as a result of the detection signal being indicative of the power supply voltage exceeding the threshold value.

Without prejudice to the underlying principles, the details and embodiments may vary, even significantly, with respect to what has been described byway of example only, without departing from the extent of protection.

The extent of protection is determined by the annexed claims.

What is claimed is:

1. A driver circuit, comprising:
   a power supply pin configured to receive a power supply voltage;
   a set of control pins configured to provide a set of respective control signals for controlling a switching activity of a set of respective switches of an h-bridge circuit, wherein the set of respective switches comprises a pair of high-side switches and a pair of low-side switches;
   sensing circuitry coupled to the power supply pin and configured to generate a detection signal indicative of the power supply voltage exceeding a threshold value; and
   control circuitry coupled to the set of control pins and sensitive to the detection signal, the control circuitry disabled in an inactive operation state and enabled in an active operation state, the control circuitry, in response to the detection signal being indicative of the power supply voltage exceeding the threshold value, being configured to:
   switch to the active operation state in response to the control circuitry being in the inactive operation state, and
   generate the control signals to activate the pair of low-side switches and de-activate the pair of high-side switches.

2. The driver circuit of claim 1, wherein the sensing circuitry coupled to the power supply pin comprises an analog comparator circuit configured to compare the power supply voltage to at least one respective threshold value.

3. The driver circuit of claim 2, wherein the analog comparator circuit comprises a comparator circuit with hysteresis, the comparator circuit with hysteresis having a lower threshold value between 21.0 V and 25.0 V, and a higher threshold value between 22.5 V and 25.5 V.

4. The driver circuit of claim 2, wherein the analog comparator circuit is selectively enable-able or disable-able as a function of a value stored in a control register of the driver circuit.

5. The driver circuit of claim 1, wherein the sensing circuitry coupled to the power supply pin comprises:
   an analog-to-digital converter circuit configured to provide a digital representation of the power supply voltage; and
   a digital circuit configured to compare the digital representation of the power supply voltage to at least one respective threshold value.

6. The driver circuit of claim 5, wherein the digital circuit comprises a digital comparator circuit with hysteresis, the digital comparator circuit with hysteresis having a lower threshold value between 18.5 V and 22.5 V and a higher threshold value between 19.5 V and 22.5 V.

7. The driver circuit of claim 5, wherein the sensing circuitry coupled to the power supply pin comprises an analog comparator circuit configured to compare the power supply voltage to at least one respective threshold value, wherein, in an active operation state, the digital circuit is enabled, and wherein, in the inactive operation state, the digital circuit is not enabled.

8. The driver circuit of claim 1, wherein the driver circuit is couplable to an h-bridge circuit coupled to an electric motor in a vehicle used to operate a power-operated trunk.

9. A system comprising:
an electric motor;
an h-bridge circuit coupled to the electric motor and configured to drive the electric motor, wherein the h-bridge circuit comprises a set of respective switches comprising a pair of high-side switches and a pair of low-side switches;
a driver circuit coupled to the h-bridge circuit, the driver circuit comprising:
a power supply pin configured to receive a power supply voltage;
a set of control pins configured to provide a set of respective control signals for controlling a switching activity of the set of respective switches of the h-bridge circuit;
sensing circuitry coupled to the power supply pin and configured to generate a detection signal indicative of the power supply voltage exceeding a threshold value; and
control circuitry coupled to the set of control pins and sensitive to the detection signal, the control circuitry disabled in an inactive operation state and enabled in an active operation state, the control circuitry, in response to the detection signal being indicative of the power supply voltage exceeding the threshold value, being configured to:
switch to the active operation state in response to the control circuitry being in the inactive operation state, and
generate the control signals to activate the pair of low-side switches and de-activate the high-side switches;
a power source configured to provide the power supply voltage to the power supply pin of the driver circuit and the h-bridge circuit; and
a processing unit coupled to the driver circuit and configured to generate at least one input signal for controlling the driver circuit.

10. The system of claim 9, wherein the sensing circuitry coupled to the power supply pin comprises an analog comparator circuit configured to compare the power supply voltage to at least one respective threshold value.

11. The system of claim 10, wherein the analog comparator circuit comprises a comparator circuit with hysteresis, the comparator circuit with hysteresis having a lower threshold value between 21.0 V and 25.0 V, and a higher threshold value between 22.5 V and 25.5 V.

12. The system of claim 11, wherein the analog comparator circuit is selectively enable-able or disable-able as a function of a value stored in a control register of the driver circuit.

13. The system of claim 9, wherein the sensing circuitry coupled to the power supply pin comprises:
an analog-to-digital converter circuit configured to provide a digital representation of the power supply voltage; and
a digital circuit configured to compare the digital representation of the power supply voltage to at least one respective threshold value.

14. The system of claim 13, wherein the digital circuit comprises a digital comparator circuit with hysteresis, the digital comparator circuit with hysteresis having a lower threshold value between 18.5 V and 22.5 V and a higher threshold value between 19.5 V and 22.5 V.

15. The system of claim 13, wherein the sensing circuitry coupled to the power supply pin comprises an analog comparator circuit configured to compare the power supply voltage to at least one respective threshold value, wherein, in an active operation state, the digital circuit is enabled, and wherein, in the inactive operation state, the digital circuit is not enabled.

16. The system of claim 9, wherein the system is a vehicle further comprising a power-operated trunk, and wherein the electric motor is configured to operate the power-operated trunk.

17. A method of operating a driver circuit, the method comprising:
receiving a power supply voltage;
generating a detection signal indicating that the power supply voltage exceeds a threshold value;
controlling, by control circuitry in an active operation state, a switching activity of a set of respective switches comprising a pair of high-side switches and a pair of low-side switches of an h-bridge circuit;
switching a control circuitry to an active operation state in response to the control circuitry being in an inactive operation state and the power supply voltage exceeding the threshold value, the control circuitry disabled in an inactive operation state and enabled in an active operation state; and
generating a set of control signals, as a function of at least one input signal received from a processing unit, to activate the pair of low-side switches and de-activate the high-side switches in response to the detection signal.

18. The method of claim 17, further comprising comparing an analog value of the power supply voltage to at least one respective threshold value.

19. The method of claim 17, further comprising:
generating a digital representation of the power supply voltage; and
comparing the digital representation of the power supply voltage to at least one respective threshold value.

20. The method of claim 17, further comprising comparing, by an analog comparator circuit, the power supply voltage to a threshold value, the analog comparator circuit having a lower threshold hysteresis value between 21.0 V and 25.0 V and a higher threshold hysteresis value between 22.5 V and 25.5 V.

* * * * *